United States Patent [19]

Terunuma et al.

[11] 4,133,018
[45] Jan. 2, 1979

[54] THYRISTOR FAULT-DETECTING APPARATUS

[75] Inventors: Mutsuhiro Terunuma, Mito; Seiya Shima, Katsuta; Korefumi Tashiro, Hitachi; Takeki Ando, Nakamachi; Hiromi Inaba, Hitachi; Toshiaki Kurosawa; Hiroaki Kuroha, both of Katsuta, all of Japan

[73] Assignee: Hitachi, Ltd., Japan

[21] Appl. No.: 806,595

[22] Filed: Jun. 14, 1977

[30] Foreign Application Priority Data

Jun. 18, 1976 [JP] Japan .................... 51-71822

[51] Int. Cl.² ........................................... H02H 7/12
[52] U.S. Cl. .......................... 361/87; 361/76; 361/85; 361/94; 363/54; 340/645
[58] Field of Search ................. 361/76, 77, 87, 84, 361/93, 85; 363/54, 57, 129, 91, 92; 323/89 P, 89 R; 307/127; 324/86, 87; 340/645, 653

[56] References Cited

U.S. PATENT DOCUMENTS

| 2,938,150 | 5/1960 | Kniel | 361/94 |
| 3,825,768 | 7/1974 | Grygera | 361/77 X |
| 3,999,087 | 12/1976 | Compton | 361/76 X |
| 4,016,468 | 4/1977 | Graf | 363/54 X |

Primary Examiner—Patrick R. Salce
Attorney, Agent, or Firm—Craig & Antonelli

[57] ABSTRACT

A thyristor fault-detecting apparatus comprises a thyristor bridge with A.C. terminals connected to a three-phase A.C. power supply and having six thyristor arms, and an inductive load connected to D.C. terminals of the bridge. Each of the A.C. paths has a saturable reactor with an output winding so set as to be excited by the line current within the range from $\pi/3$ to $2\pi/3$ (rad). Output voltages of the reactors are rectified and added, so that a fault in the thyristor is detected by the disappearance of the added output.

6 Claims, 11 Drawing Figures

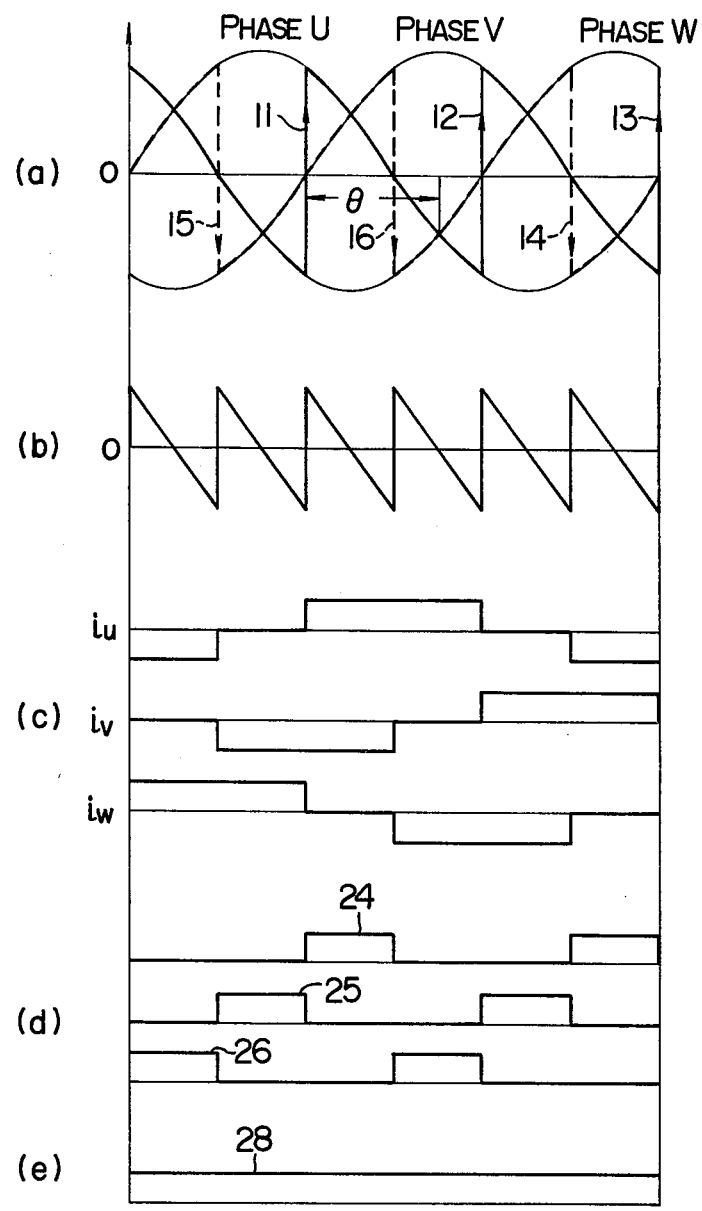

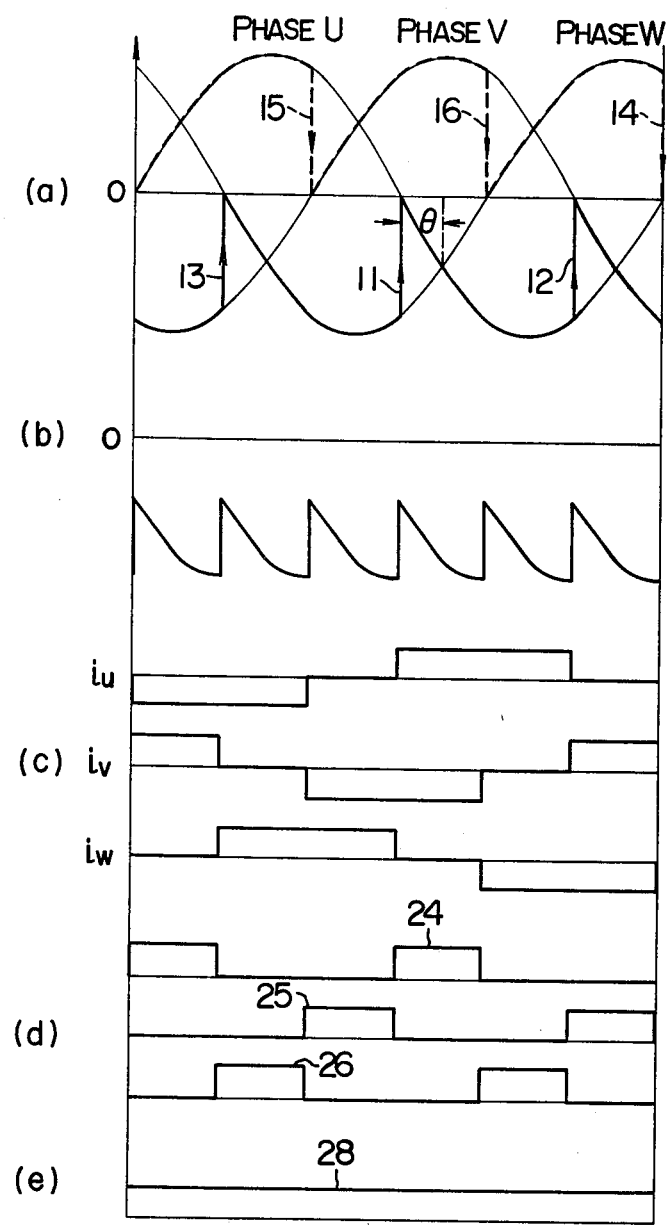

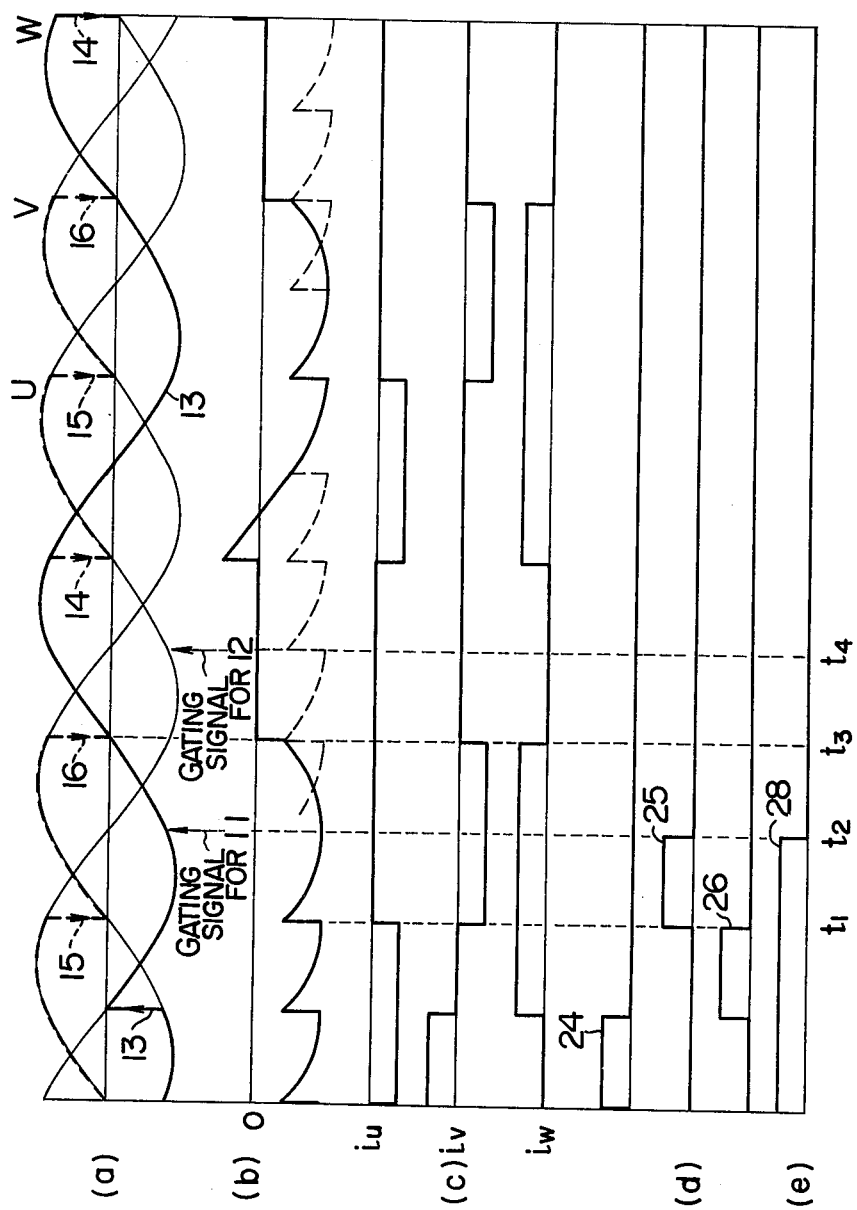

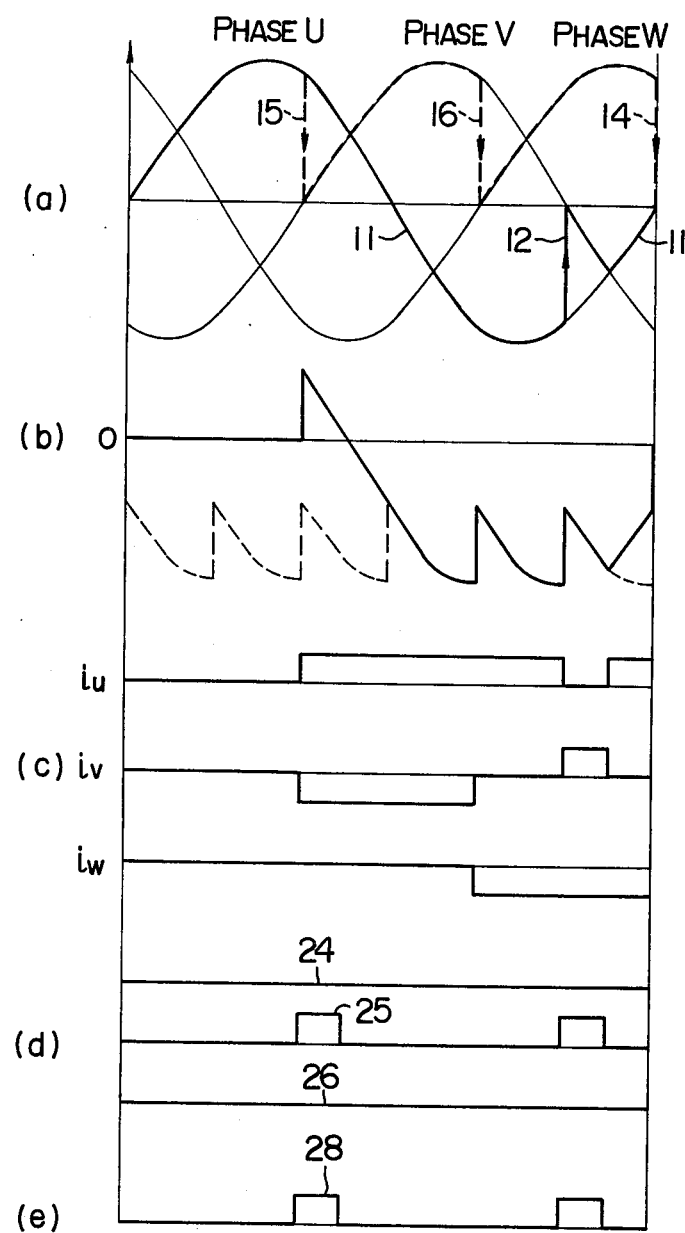

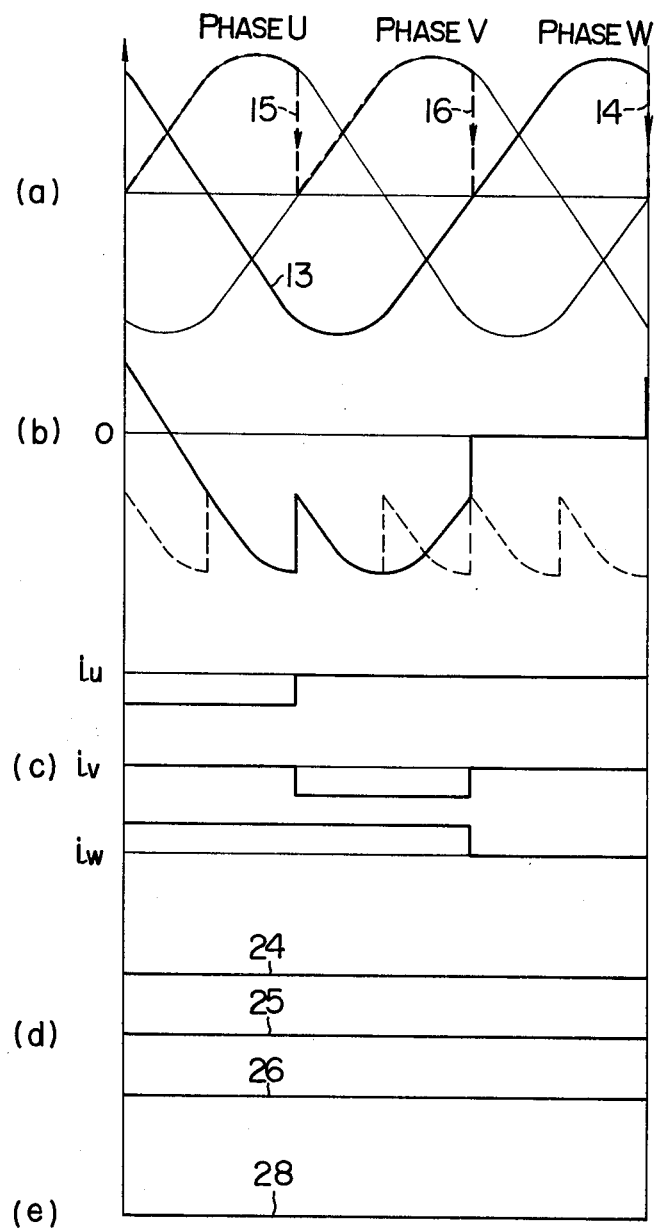

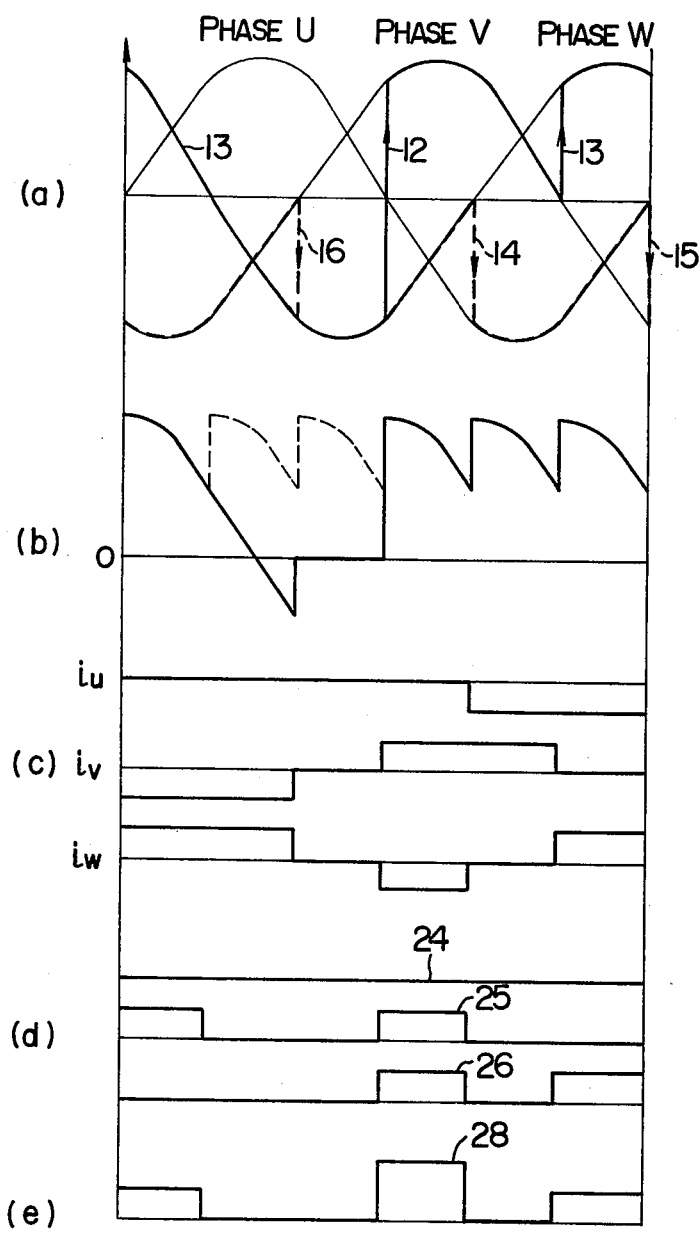

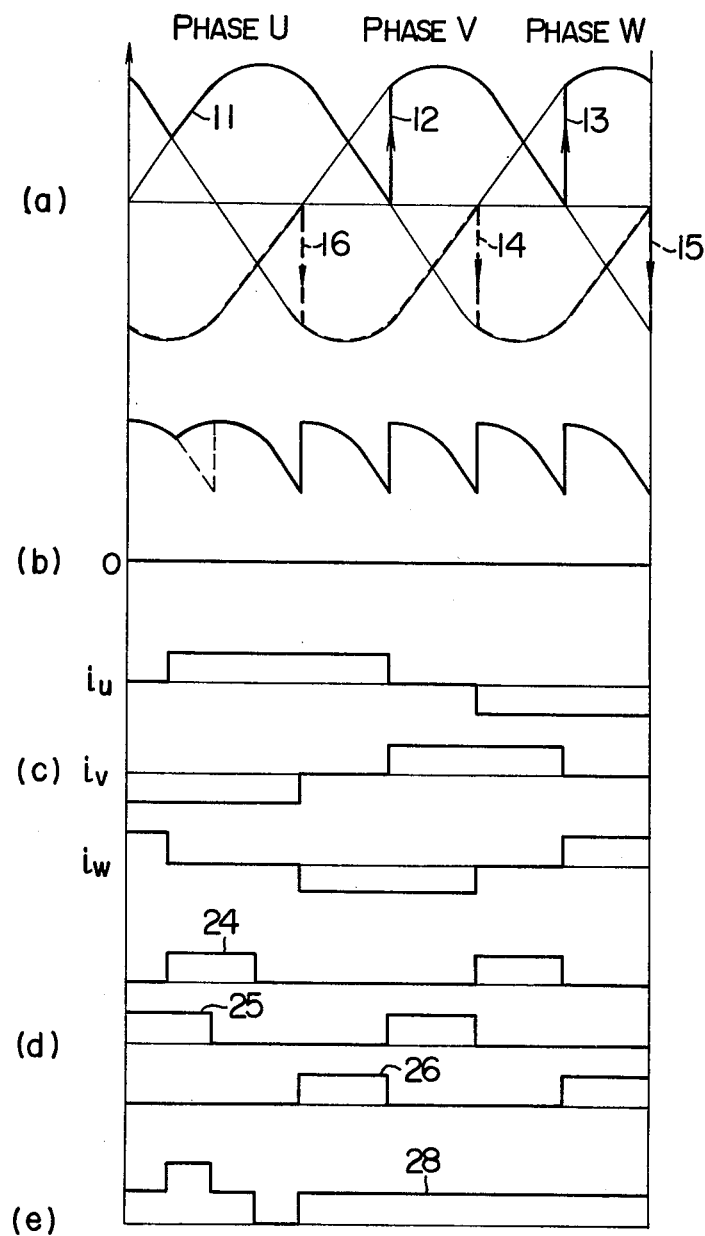

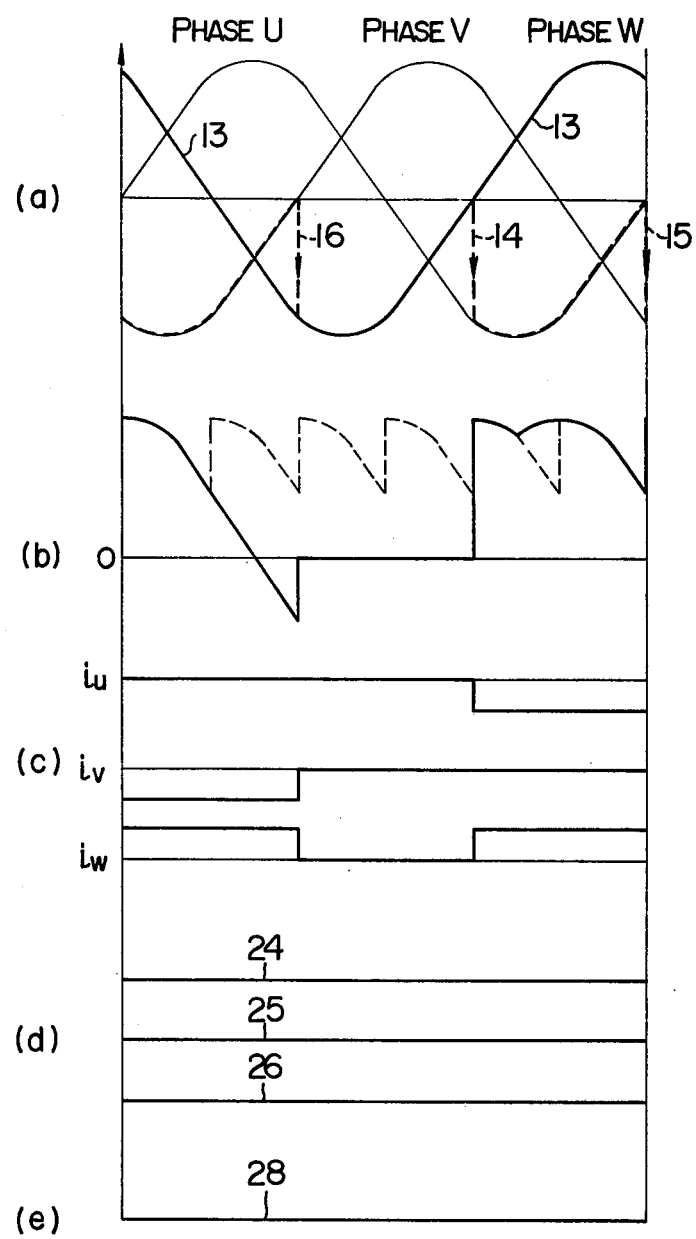

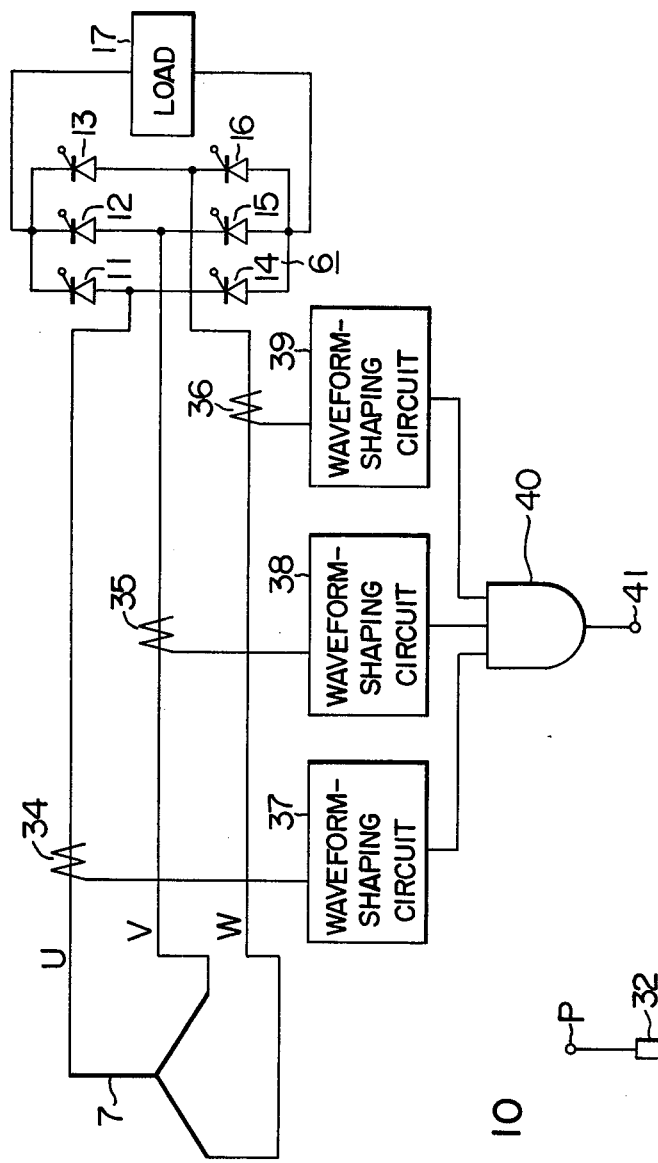
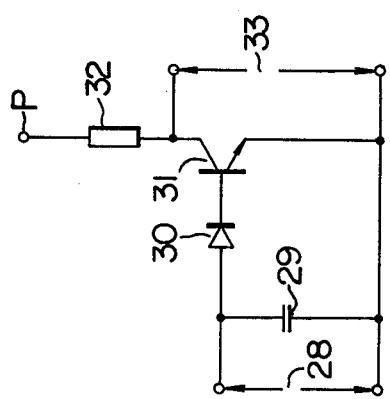
FIG. 11
FIG. 10

THYRISTOR FAULT-DETECTING APPARATUS

This invention relates to an apparatus for detecting a fault in a thyristor bridge connected between multiphase A.C. power supplies and a D.C. load.

A thyristor bridge is widely used in many fields of application as a power transducer for converting alternating current into direct current or direct current into alternating current.

A fault of any of the thyristor in the thyristor bridge, if not found early, will often lead to a serious trouble of the equipment involved.

Two conventional methods for detecting thyristor faults are well known. One is to determine whether each thyristor has a fault or not by comparing the gating signal of each thyristor with the output current. The other method is by comparing the voltage of each phase with the output current for detecting a fault for each thyristor.

Both of these methods, however, have a complicated circuit configuration and are high in cost as a thyristor fault-detecting apparatus for a multiphase thyristor bridge with three or more phases used for many purposes.

An object of the present invention is to provide a thyristor fault-detecting apparatus comprising a multiphase thyristor bridge with A.C. terminals connected to a multiphase A.C. power supply, and an inductive load connected to D.C. terminals of the bridge, which is economical and capable of detecting any fault in the thyristors.

According to the present invention, there is provided a thyristor fault-detecting apparatus comprising means for generating an electrical signal which rises at a rise point of each line current of each of multiphase lines connecting a multiphase A.C. power supply and A.C. terminals of a thyristor bridge, the means being provided for each of the multiphase lines, the electrical signal disappearing at selected one of a time point after a predetermined period of time and a time point of disappearance of the line currents, whichever occurs earlier, and means actuated in response to the disappearance of all the electrical signals associated with the phases.

The present invention will be apparent from the following detailed description taken in conjunction with the accompanying drawings in which:

FIGS. 2 and 3 are time charts showing waveforms of voltages and currents at various parts under normal conditions at the firing angles $\theta$ of $\pi/2$ and $\pi/6$ respectively;

FIGS. 4 to 6 are time charts associated with a fault of thyristors at the firing angle $\theta$ of $\pi/6$ when a thyristor arm is non-conducting, a thyristor acts as a diode an account of failure thereof, and two thyristor arms are non-conducting, respectively;

FIGS. 7 to 9 show fault conditions at the firing angle $\theta$ of $5\pi/6$, respectively in the time charts of FIGS. 4 to 6;

FIG. 10 is a wiring diagram showing an example of the circuit for producing a thyristor fault-detecting signal; and FIG. 11 is a wiring diagram showing another embodiment of the invention.

Figure 1:
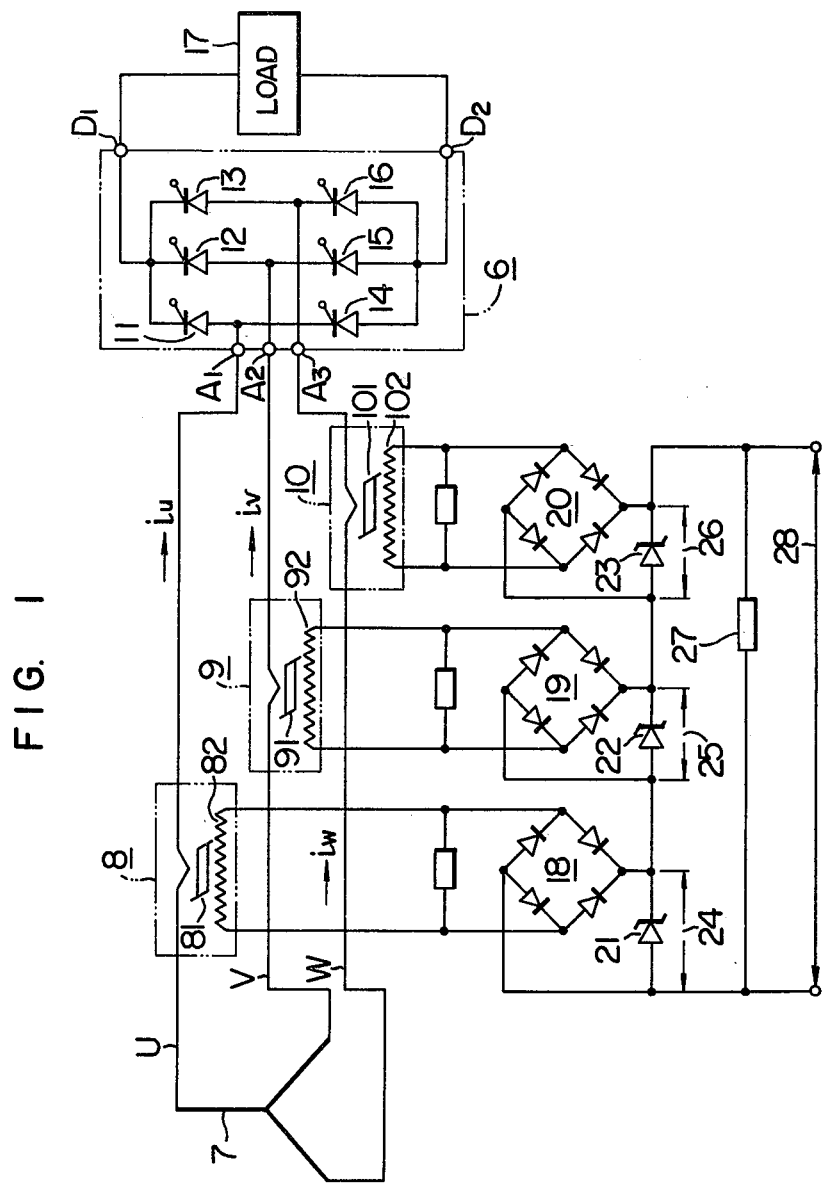
FIG. 1 is a wiring diagram showing a preferred embodiment in which a thyristor fault-detecting apparatus according to the present invention is used with a three-phase full-wave thyristor bridge.

An embodiment of the invention which is applied to a three-phase thyristor bridge will be described below with reference to FIG. 1. In this drawing, reference numeral 6 shows a three-phase full-wave thyristor bridge. The A.C. terminals A1, A2 and A3 of this bridge are connected to a three-phase A.C. power supply 7 by phase lines U, V and W respectively. The thyristor bridge 6 has six thyristor arms having thyristors 11 to 16 respectively. The D.C. terminals D1 and D2 of the thyristor bridge 6 are connected with an inductive load 17. From a gating signal-generator not shown, a phase-controlled gating signal is applied between the gate and the cathode of each of the thyristors 11 to 16, thereby enabling application and receipt of power between the three-phase A.C. power supply 7 and the D.C. load 17 through the thyristor bridge 6.

The phase lines U, V and W are connected with saturable reactors 8, 9 and 10 with output windings respectively. The saturable reactors 8 to 10 include saturable magnetic cores 81, 91 and 101 excited by each phase line current, and output windings 82, 92 and 102 wound on the magnetic cores respectively. Output voltages produced across the respective output windings are converted into direct current by full-wave rectifiers 18 to 20 respectively and applied across zener diodes 21 to 23 respectively. The zener diodes 21 to 23 are connected in series with each other, so that the voltage sum 28 of the terminal voltages 24 to 26 are applied to a resistor 27.

In this configuration, the operation of this apparatus in the absence of any fault of the thyristors will be explained with reference to FIGS. 2 to 4.

FIG. 2 shows normal conditions of the apparatus with the thyristor-firing angle $\theta$ of 90° ($\pi/2$). In (a) of FIG. 2 are shown phase voltages of respective phases (thin lines), the voltage at the D.C. terminal D1 (thick line) and the voltage at the D.C. terminal D2 (thin dashed line). The voltages of the D.C. terminals D1 and D2 largely depend on the commutation of the thyristors 11 to 16. Such dependent changes are denoted by the numerals of the associated thyristors fired respectively. In this drawing, the angle $\theta$ is defined as a firing angle, which is 90° for the case under consideration. In the case where the load has no time constant such as a resistance load, reversal of the interphase voltage causes the deenergization of a thyristor. For instance, when the phase voltage of phase U is reduced below that of the phase V after the thyristor 11 was fired, the thyristor 11 is deenergized. In the case where an inductive load is involved, on the other hand, even when the phase voltage of phase U becomes lower than that of phase V, the thyristor 11 continues to be kept on by the load voltage due to the inductance until a gating signal is applied to the thyristor 12.

An output voltage of the thyristor bridge 6 which is supplied to the load 17 is shown in (b) of FIG. 2, and the relative times of currents $i_U$, $i_V$, and $i_W$ flowing in respective phases in (c) of FIG. 2. Further, the voltages 24 to 26 applied to the zener diodes 21 to 23 in FIG. 1 are shown in (d) of FIG. 2, and the voltage 28 which is the sum of all the voltages in (d) of FIG. 2 and applied to the resistor 27 is shown in (e) of FIG. 2.

The upper limit of the voltages of the output windings 82 to 102 of the saturable reactors 8 to 10 are respectively limited to the sum of the blocking layer voltages of two of the diodes included in the diode bridges 18 to 20 and the voltages of the zener diodes 21 to 23. Assuming that the saturable reactors 8 to 10 are designed to be saturated at 60° of the phase of the A.C. power supply, therefore, the voltages 24 to 26 shown in (d) of FIG. 2 are applied to the zener diodes 21 to 23 respectively.

Under normal conditions in the absence of any fault of the thyristors, a sum 28 of these voltages assumes a fixed values as shown in (e) of FIG. 2.

The normal operation of the apparatus at the firing angle $\theta$ of 30° ($\pi/6$) of the thyristors is shown in FIG. 3. In this case, the D.C. output voltage of the thyristor bridge 6 shown in (b) of FIG. 3 has a negative polarity, so that the apparatus functions as an inverter (reverse conversion). Under this condition, the power stored in the inductive load 17 is returned to the A.C. power supply. Notwithstanding, each thyristor conducts for 120°, and the currents $i_U$, $i_V$ and $i_W$ flow in the phase lines U, V and W respectively with the phase difference of 120° therebetween for the period of 120° respectively. As a result, the output voltage 28 of the apparatus according to the invention as shown in (e) of FIG. 3 continues to assume a fixed value as in FIG. 2.

Under the normal conditions where the thyristor-firing angle is larger than 90°, on the other hand, the D.C. output voltage of the thyristor bridge 6 is positive in polarity, so that the apparatus functions as a converter (for forward conversion) (not shown in the drawings). In this case, power is supplied to the load 17 from the A.C. power supply 7. It will be understood that even under this condition, the output voltage 28 of the apparatus according to the invention is kept at a fixed value.

As apparent from the explanation with reference to FIGS. 2 to 3, so far as the thyristor bridge 6 is in normal operation, the output voltage 28 of the apparatus is kept at a fixed level. By use of this feature, the absence of any fault may be detected.

The operation of the apparatus in the presence of a fault in the thyristor bridge 6 will be explained next. There may be any of three types of fault of the arms of the thyristors: (i) non-conductive state in both forward and reverse directions (breaking), (ii) kept conducting only in forward direction(diode), and (iii) kept conducting in both forward and reverse directions (short-circuited), where the words in parentheses show equivalent conditions.

In order to evidence that the apparatus according to the invention is capable of detecting a fault of the thyristor arms under any controlled condition, explanation will be made below with reference to the firing angles $\theta$ of 30° and 150° separately.

The diagram of FIG. 4 shows the operation of the apparatus in the case of a fault by which the thyristor 11 or an arm including the thyristor 11 is broken under the controlled condition of the firing angle ($\theta$) of 30°.

Assume that the thyristor 11 or the arm including the thyristor 11 is broken immediately before the time point $t_2$ when a gating signal is to be applied to the thyristor 11. Before the time point $t_2$, the apparatus operates normally as in FIG. 3. At time point $t_2$ when the gating signal is applied to the thyristor 11, the thyristor 11 fails to be fired due to the fault. As a result, the thyristor 13 which was conducting from before the time point $t_2$ is incapable of commutation to the thyristor 11 and is kept conducting after time point $t_2$. The line current $i_W$ of phase W continues to flow after time point $t_2$ as shown in (c) of FIG. 4, while no line current $i_U$ of phase U flows.

The saturable reactors 8 to 10 are set so as to be saturated after the line currents associated therewith continue to flow for the period of 60° respectively. Therefore, the saturable reactor 9 is saturated at time point $t_2$ after 60° of the time point $t_1$ when the line current $i_V$ of phase V begins to flow, and the voltage 25 is extinguished at time point $t_2$. Since the phase-U line current $i_U$ fails to be generated, the voltage 24 is also kept zero. Although the phase-W line current $i_W$ continues to flow, the saturable reactor 10 is already saturated at time point $t_1$, and therefore the voltage 26 is also kept zero. The result is that, after the time point $t_2$, all the voltages 24, 25 and 26 are reduced to zero, so that the sum 28 of these voltages is also reduced to zero. This indicates a fault of the thyristor bridge 6.

Subsequently at time point $t_3$, a gating signal is applied to the thyristor 16 and commutation occurs from the thyristor 15 to the thyristor 16. The voltage across the inductive load 17 causes the only current flow in the closed loop including the load 17, the terminal D2, thyristor 16, thyristor 13, terminal D1 and load 17, with the result that the currents $i_U$, $i_V$ and $i_W$ for respective phases cease to flow. Further, at the time point $t_4$ when a gating signal is applied to the thyristor 12, the phase-V voltage is lower than the phase-W voltage, so that no commutation occurs from the thyrsitor 13 to the thyristor 12 but the current continues to flow in the closed loop. The thyristor 13 is subsequently kept conductive, and only the thyristors 14, 15 and 16 on the negative side are successively subjected to commutation. After the breakdown of the thyristor 11 or the arms of the thyristor 11, therefore, the current flows only in one direction in the phase lines U, V and W. In other words, in the U and V phase lines where the thyristors 11 and 12 fail to conduct, only the current in negative direction flows, while in the W-phase line where the thyristor 13 is kept conducting, the current only in the positive direction continues to flow for a period other than the period when the closed loop is formed.

For this reason, as well known, the saturable reactors 8 to 10, once saturated, are kept saturated and the output voltages 24 to 26 are kept at zero. In short, upon occurrence of a breakdown in an arm, the output voltage 28 of the apparatus according to the invention is kept reduced to zero.

Thus any breakdown within the thyristor bridge 6 may be detected quickly.

The diagram of FIG. 5 shows a case in which the thyristor 11 functions as a diode at the firing angle ($\theta$) of 30°. The output voltage thereof becomes very high to the positive side with the firing of the thyristor 15 as shown in (b) of FIG. 5. Since the thyristor 11 acts as a diode, the thyristor 12 is de-energized if the V-phase voltage is rendered lower than that of U-phase. As a result, the U-phase current is interrupted as shown in (c) of FIG. 5. It is only in V-phase that the phase current flow alternates between positive and negative sides. In view of the fact that the thyristor 12 is cut off in the range where the V-phase voltage is lower than the U-phase voltage, however, the phase current on positive side flows in that range only for the section of 30° in phase. As a result, the output of the saturable reactor 9 is produced only for the section of 30°, so that the voltage as shown in (d) of FIG. 5 is produced. In this way, the output voltage of the apparatus according to this embodiment never fails to assume the value of zero as shown in (e) of FIG. 5, thus making fault detection possible.

The cases of breakdown of both the thyristors 11 and 12 at the firing angle (θ) of 30° are shown in FIG. 6. Since the thyristors 11 and 12 fail to be fired, the same principle applies to this case as the case of FIG. 4 involving the breakdown of the thyristor 11 for the section of 30° in θ, and will not be repeated.

Next, explanation will be made about the case in which the firing angle (θ) of 150° is involved. Under normal conditions of the thyristors, the only difference from the case involving the firing angle (θ) of 30° lies in that a positive output voltage is produced from the thyristor bridge. The other points will not be explained as they are easily inferred from the case of θ of 30°.

The diagram of FIG. 7 illustrates the case of breakdown of the thyristor 11 at the firing angle (θ) of 150°. Since the U-phase current flows only in the negative direction, the voltage 24 applied to the zener diode 21 is zero. In view of the fact that the phase currents of V and W phases change between positive and negative sides, voltages corresponding to the phase section of 60° of the power supply are applied in the form of the voltages 25 and 26. Thus the voltage sum as shown in (e) of FIG. 7 is obtained.

The case in which the thyristor 11 functions as a diode at the firing angle (θ) of 150° is shown in FIG. 8. It was already explained that, as long as the firing angle θ is larger than 120°, the U-phase voltage is in no way higher than the W-phase voltage if the thyristor 14 is fired, so that both the thyristors 11 and 12 are not in conductive state. As a result, the phase current is continuous as shown in (c) of FIG. 8. This makes it impossible for the conventional systems to detect a fault. According to the apparatus of the present invention, the saturable reactors 8 to 10 are adapted to produce an output only for the phase section of 60° of the power supply, and therefore the voltages 24 to 26 applied to the zener diodes 21 to 23 take the forms as shown in (d) of FIG. 8. By adding these voltages to each other, a section appears as shown in (e) of FIG. 8 where no output is produced for 30° in phase. This indicates that an arrangement should be made to produce an output for a period less than 90° (= 60° + 30°). Any fault is thus capable of being detected even if a continuous phase current flows.

FIG. 9 shows the case in which both the thyristors 11 and 12 are broken at the firing angle (θ) of 150°. The phase currents of U, V and W all flow only in one of the directions of positive or negative, so that the output of the saturable reactors 8 to 10 becomes zero. As shown in (d) and (e) of FIG. 9, therefore, the applied voltages and the voltage sum thereof are both reduced to zero.

When an element is broken by the short-circuiting, the breakdown thereof or a burnt-out fuse prevents the flow of phase currents, And several milliseconds after the fault, the apparatus is actuated to generate a detection signal as in the case of the aformentioned breakdown of an element or a fault of a diode condition. Therefore, the trouble due to the short-circuiting of an element will not be explained.

The diagram of FIG. 10 shows a circuit for producing a detection signal in response to the voltage sum 28 detected by the apparatus of the invention, only at the time of a thyristor fault. In other words, as long as the thyristor is not in trouble, a fixed value of the voltage sum 28 is continuously produced. If adjustment is so made as to conduct the transistor 31 at this constant value of output, therefore, there always appears a section in which the voltage sum 28 becomes zero at the time of fault of the thyristor. At that time, the transistor 31 is cut off and a detection signal is produced at the output 33. By the way, in the drawing, numeral 29 shows a capacitor, numeral 30 a diode, numeral 32 a resistor, and character P a positive electrode of a D.C. power supply.

In the case of a trouble in which a thyristor element functions as a diode in phase, of all the troubles of thyristors of a three-phase full-wave rectification thyristor bridge, the conventional systems have the disadvantage that, because of the above-mentioned interruption of phase currents above 120° in the firing phase angle θ, no fault of the thyristors can be detected. In the detecting apparatus according to the embodiment under consideration, however, all faults associated with up to 180° in the firing phase angle θ may be detected by selecting the saturation angle of the saturable reactor at 60° to 120°.

In view of this, the relation between the saturation angle of the saturable reactor and the firing angle θ will be discussed below.

Now, assume that the firing angle of $\theta_1$ is involved, which is not smaller than 120°. If the firing angle is less than 120°, a fault may be successfully detected even when the upper limit of the saturation angle is determined at 120°.

The magnitude of the firing angle 120° when the sum of phase currents begins to continuously flow is subtracted from $\theta_1$ as shown below.

$$\theta_1 - 120° = \theta_2 \tag{1}$$

Here, the angle $\theta_2$ means something like a lack of margin of saturation angle. By subtracting $\theta_2$ from the saturable maximum angle of 120°, therefore, the upper limit of the saturation angle at the firing angle $\theta_1$ is obtained. Thus, $$\beta \leq 120° - \theta_2 \tag{2}$$

As a result, the tolerable range of the saturation angles of the saturable reactor at the firing angle $\theta_1$ is from 60° to (120° − $\theta_2$).

This will be described more specifically with reference to FIG. 8. Since the firing angle $\theta_1$ is 150°, the equation (3) below is derived from equation (1).

$$\theta_2 = 150° - 120° = 30° \tag{3}$$

From equation (2), $$\beta \leq 120° - 30° = 90° \tag{4}$$

It is thus found that the upper limit of the saturation angle of the saturable reactor is 90° and that the tolerable angles range from 60° to 90°.

This range of saturation angles $\beta$ of the saturable reactor is generally expressed by the equation (5) below.

$$\frac{2\pi}{n} \leq \beta \leq \frac{4\pi}{n} \tag{5}$$

where n is the number of thyristors making up a multiphase thyristor bridge.

Another embodiment of the present invention is shown in FIG. 11. In this drawing, like reference numerals or characters denote like to equivalent component elements in FIG. 1. According to this embodiment, current-detecting devices 34 to 36 are provided for the three-phase A.C. lines U, V and W respectively to detect line currents, and a voltage is produced that, rising with the rise of the line currents, has a maximum time length of $2\pi/n$ to $4\pi/n$ and disappears immediately upon disappearance of the line currents. Outputs of the waveform-shaping devices 37 to 39 are applied to an AND circuit 40, so that the output of the AND circuit 40, i.e., the output 41 of the detecting device is used to detect a fault of the thyristors. The waveform-shaping devices 37 to 39 may of course be made up of logic circuits.

The foregoing description is concerned with a thyristor bridge of three-phase full-wave type. The present invention, however, is not limited to the three-phase full-wave system but may of course be applicable also to the detection of a fault of thyristors of a thyristor bridge of three-phase half-wave type, six-phase half-wave or other multi-phase type. For application to a three-phase half-wave type of thyristor bridge, for example, the maximum time length of the pulse ranges from 120° to 240° for n is 3; and for application to a six-phase half-wave type, it ranges from 60° to 120° because of n being 6.

It will be seen from the foregong description that according to the present invention, any type of fault of thyristors included in a power converter comprising a multi-phase thyristor bridge and an inductive load may be instantaneously detected with a simple apparatus.

What is claimed is:

1. A thyristor fault-detecting apparatus comprising a thyristor bridge including n thyristor arms with A.C. terminals connected to a multi-phase A.C. power supply, and an inductive load connected to the D.C. terminals of said thyristor bridge; said apparatus further comprising means provided respectively for multi-phase lines connecting to said power supply and said A.C. terminals, said means generating an electrical signal which, rising with the rise of currents of said respective lines, disappears at an earlier one of a time point after the lapse of $2\pi/n$ to $4\pi/n$ from said rise of said electrical signal and a time point when said line currents disappear, and detection means actuated in response to the disappearance of all of said electrical signals associated with said respective phases.

2. A thyristor fault-detecting apparatus according to claim 1, in which said detection means include means for adding said electrical signals associated with respective phase lines to each other, and means actuated in response to the disappearance of an output signal of said adding means.

3. A thyristor fault-detecting apparatus according to claim 1, further comprising means for converting said electrical signals into voltage signals with a fixed crest value, said converting means being actuated in response to the disappearance of all of said voltage signals associated with respective phases.

4. A thyristor fault-detecting apparatus according to claim 1, in which said means for generating electrical signals comprises a saturable reactor, which in turn includes a saturable magnetic core excited by said line currents and an output winding wound on said magnetic core.

5. A thyristor fault-detecting apparatus according to claim 4, further comprising means for rectifying the voltage across said output winding.

6. A thyristor fault-detecting apparatus comprising a thyristor bridge including six thyristors arms with A.C. terminals connected to a three-phase A.C. power supply, and an inductive load connected to the D.C. terminals of said thyristor bridge; said apparatus further comprising means provided respectively for three-phase lines connecting to said power supply and said A.C. terminals, said means generating an electrical signal which, rising with the rise of currents of said respective lines, disappears at an earlier one of a time point after the lapse of $2\pi/3$ to $4\pi/3$ from said rise of said electrical signal and a time point when said line currents disappear, and means actuated in response to the disappearance of all of said electrical signals associated with said respective phases.

* * * * *